United States Patent
Lebed

(10) Patent No.: US 11,358,222 B2
(45) Date of Patent: Jun. 14, 2022

(54) ADDITIVE MANUFACTURING METHOD

(71) Applicant: Siemens Energy Global GmbH & Co. KG

(72) Inventor: Yaroslav Lebed, Berlin (DE)

(73) Assignee: SIEMENS ENERGY GLOBAL GMBH & CO. KG, Munich (DE)

( * ) Notice: Subject to any disclaimer, the term of this patent is extended or adjusted under 35 U.S.C. 154(b) by 274 days.

(21) Appl. No.: 16/480,697

(22) PCT Filed: Feb. 16, 2018

(86) PCT No.: PCT/EP2018/053907
§ 371 (c)(1),
(2) Date: Jul. 25, 2019

(87) PCT Pub. No.: WO2018/166752
PCT Pub. Date: Sep. 20, 2018

(65) Prior Publication Data
US 2020/0001365 A1    Jan. 2, 2020

(30) Foreign Application Priority Data
Mar. 17, 2017  (EP) .................................... 17161586

(51) Int. Cl.
*B22F 10/20* (2021.01)
*B22F 5/10* (2006.01)
(Continued)

(52) U.S. Cl.
CPC ................ *B22F 10/20* (2021.01); *B22F 5/10* (2013.01); *B29C 64/35* (2017.08); *B29C 64/386* (2017.08); *B33Y 10/00* (2014.12); *B33Y 50/00* (2014.12)

(58) Field of Classification Search
None
See application file for complete search history.

(56) References Cited

U.S. PATENT DOCUMENTS 7,601,422 B2   10/2009   Gersch et al.
2015/0154321 A1  6/2015   Schmidt et al.
(Continued)

OTHER PUBLICATIONS

Anonymous: "ZPrinter650 Hardware Manual ", ZCorporation, pp. 1-93, XP055395619, retrieved from the Internet: URL:https://www.bibus.hu/fileadmin/editors/countries/bihun/product_data/zcorp/documents/zcorp_series_zprinter_650_hardware_manual_en.pdf, retrieved on Aug. 2, 2017, p. 4, pp. 19-20, pp. 33-34, the whole document; 2008.

(Continued)

*Primary Examiner* — Colin W. Slifka

(57) ABSTRACT

A method for producing a three-dimensional component having one or more cavities by powder-based additive manufacturing, such as selective laser melting or electron beam melting, using an additive manufacturing machine. The method includes creating 3D-CAD-data of the component to be produced using a computer-aided design method; b) identifying the cavities of the component in the 3D-CAD-data and verifying, that each cavity has at least one outlet passage connecting the cavity to the outer environment of the component, wherein, if there is no such outlet passage, it is created within the 3D-CAD-data; c) producing the component on a construction platform of the additive manufacturing machine on the basis of the 3D-CAD-data; d) removing powder present within the cavities and within the outlet passages through the outlet passages and e) heat-treating the construction platform and the component arranged thereon in a heat treatment oven.

7 Claims, 3 Drawing Sheets

(51) Int. Cl.
  *B33Y 10/00*    (2015.01)
  *B33Y 50/00*    (2015.01)
  *B29C 64/386*   (2017.01)
  *B29C 64/35*    (2017.01)

(56) References Cited

U.S. PATENT DOCUMENTS

2016/0074940 A1  3/2016  Cote et al.
2016/0136883 A1  5/2016  Schmidt

OTHER PUBLICATIONS

Anonymous: "Aluminum 3D Printing Material Information", XP055398059, retrieved from the Internet: URL:https://web.archive.org/web/20170126111116/https://www.shapeways.com/materials/aluminum/, retrieved on Aug. 10, 2017, p. 1, 3, the whole document; 2017.

Yadroitsey I et al., "Selective laser melting of Ti6A14V alloy for biomedical applications: Temperature monitoring and microstructural evolution", Journal of Alloys and Compounds, pp. 404-409, XP055471106.

Thoene, et al., "Influence of heat-treatment on Selective Laser Melting product—e.g. Ti6A14V"; Retrieved from the Internet: URL:https://sffsymposium.engr.utexas.edu/Manuscripts/2012/2012-38-THOENE.pdf; [retrieved on Apr. 26, 2018], Title, abstract, Introduction, third paragraph the whole document / Jan. 15, 2014.

PCT International Search Report and Written Opinion of International Searching Authority dated May 8, 2018 corresponding to PCT International Application No. PCT/EP2018/053907 Feb. 16, 2018.

ADDITIVE MANUFACTURING METHOD

CROSS REFERENCE TO RELATED APPLICATIONS

This application is the US National Stage of International Application No. PCT/EP2018/053907 filed Feb. 16, 2018, and claims the benefit thereof. The International Application claims the benefit of European Application No. EP17161586 filed Mar. 17, 2017. All of the applications are incorporated by reference herein in their entirety.

FIELD OF INVENTION

The present invention relates to a method for producing a three-dimensional component having one or more cavities by powder-based additive manufacturing, such as selective laser melting or electron beam melting, using an additive manufacturing machine, said method comprising the steps of: a) creating 3D-CAD-data of the component to be produced using a computer-aided design method, wherein said 3D-CAD-data are suitable to be processed by the additive manufacturing machine; b) identifying the cavities of the component in the 3D-CAD-data and verifying, that each cavity has at least one outlet passage connecting the cavity to the outer environment of the component, wherein, if there is no such outlet passage, it is created within the 3D-CAD-data; c) producing the component on a construction platform of the additive manufacturing machine on the basis of the 3D-CAD-data; d) removing powder present within the cavities and within the outlet passages through said outlet passages and e) heat-treating the construction platform and the component arranged thereon in a heat treatment oven.

BACKGROUND OF INVENTION

Powder-based additive manufacturing methods, such as selective laser melting or electron beam melting, are already known in prior art. They enable the manufacture of components directly on the basis of 3D-CAD-data of the component. The additive manufacturing machine normally comprises a construction platform which can be charged in layers with powder of the component material. A laser or electron beam is directed onto the in each case formed powder surface where the particles of the powder can be melted locally. The 3D-CAD-data representing the geometry of the component to be manufactured are processed in the machine in such a manner, that the component arises in layers in the powder bed on the construction platform. After completion of the 3D-printing process the construction platform and the component arranged thereon are normally heat-treated in a heat treatment oven in order to optimize the microstructure of the newly generated component. An additive manufacturing machine of the above-mentioned type is known, for example from U.S. Pat. No. 7,601,422 B2.

During the 3D-printing process of components having cavities, the cavities are filled with loose powder of the component material while building up the component in layers. Accordingly, after completion of the 3D-printing process this powder present within the cavities has to be removed prior to the following heat treatment process. Against this background it is of great importance to provide each cavity with at least one outlet passage connecting the cavity to the outer environment of the component, through which the powder can be discharged. Thus, during the design phase of the component each cavity has to be identified in the 3D-CAD-data by the designer in order to verify that it has at least one such outlet passage. If no such outlet passage can be detected, because it has been forgotten by the designer, the designer has to create it in the 3D-CAD-data to obtain a manufacture of the component free from defects. However, making sure that the designer checks each and every cavity for missing outlet passages is a difficult task, in particular if the component to be produced has lots of such cavities or if the designer is not very familiar with the 3D-printing process. To make matter worse outlet passages present in the 3D-CAD-data can be blocked by the construction platform depending on the orientation of the component relative to the construction platform, because at least most of the programs used at present to create 3D-CAD-data of the component do not consider the construction platform but only the component itself.

SUMMARY OF INVENTION

Against this background it is an object of the present invention to provide an alternative method of the above-mentioned kind for producing a three-dimensional component having one or more cavities by powder-based additive manufacturing.

In order to solve this object the present invention provides a method of the above-mentioned kind, which is characterized in that at least the sub-steps of step b) of identifying the cavities of the component within the 3D-CAD-data and of verifying, that each cavity has at least one outlet passage connecting the cavity to the outer environment of the component, are performed automatically by applying an algorithm on the 3D-CAD-data, and, if a cavity without an outlet passage is detected, an alarm signal is output to alert the designer and/or an outlet passage is automatically calculated and proposed to the designer and/or an outlet passage is automatically calculated and automatically created in the 3D-CAD-data. Thanks to the application of such an algorithm on the 3D-CAD-data created in step a) it is not possible to forget outlet passages needed for the removal of the powder. Accordingly, the number of deficient components and thus the costs are reduced.

According to the first of the above-mentioned alternatives an alarm signal is output to alert the designer with respect to missing outlet passages. Accordingly, when such an alarm signal is output, the designer can add the missing outlet passage or passages in the 3D-CAD-data. The position of the cavity with the missing outlet passage can automatically be indicated to the designer in that matter in order to facilitate his work. In addition or alternatively, an outlet passage is automatically calculated and proposed to the designer by said algorithm. Accordingly, the designer just needs to confirm the proposal in order to automatically create the proposed outlet passage in the 3D-CAD-data. If the designer is not satisfied with the proposed geometry or position of the proposed outlet passage he can reject the proposal and manually design and create an outlet passage in the 3D-CAD-data on his own. Alternatively or in addition it is also possible that an outlet passage is automatically calculated and automatically created in the 3D-CAD-data, if a cavity without an outlet passage is detected. Thus, an interaction with the designer is no longer necessary.

Preferably, the sub-step of verifying that each cavity has at least one outlet passage connecting the cavity to the outer environment of the component is performed in consideration of an intended orientation of the component relative to the construction platform during step c). This ensures that an outlet passage present in the 3D-CAD-data will not subsequently be blocked by the construction platform during execution of step c).

If it is detected in step b), that one or more outlet passages are blocked by the construction platform, the method advantageously comprises the further steps of outputting an alarm signal to alert the designer and/or of automatically calculating new and/or modified outlet passages and proposing them to the designer and/or of automatically calculating and automatically creating new and/or modified outlet passages in the 3D-CAD-data.

Alternatively or in addition, if it is detected in step b), that one or more outlet passages are blocked by the construction platform, the method of the present invention advantageously comprises the further steps of automatically verifying whether or not alternative orientations of the component relative to the construction platform are possible, which lead to less or no missing outlets, and, if an alternative orientation is found, of proposing said alternative orientation to the designer or of automatically choosing said alternative orientation and automatically calculating and creating missing and/or modified outlet passages in the 3D-CAD-data. In other words, in addition to an amendment of the 3D-CAD-data of the component itself it is checked whether or not it is reasonable to (also) change the orientation of the component relative to the construction platform in order to facilitate the manufacture of the component, its cavities and its outlet passages.

According to one aspect of the present invention it is verified in step b) that each cavity has at least two outlet passages connecting the cavity to the outer environment of the component, wherein, if there are no such two outlet passages, they are created in the 3D-CAD-data, wherein, if a cavity without two outlet passages is detected, an alarm signal is output to alert the designer and/or the missing outlet passages are automatically calculated and proposed to the designer and/or the missing outlet passages are automatically calculated and automatically created within the 3D-CAD-data. Thus, it is ensured that each cavity comprises two outlet passages in order to facilitate the removal of the powder in step d).

Preferably, the two outlet passages of each cavity have diameters of different size.

Advantageously, the outlet passage of larger diameter is used in step d) to introduce pressurized air in order to blow out the powder present within the corresponding cavity through the outlet passage of smaller diameter.

BRIEF DESCRIPTION OF THE DRAWINGS

Further features and advantages of the method according to the present invention will become apparent for the skilled person when studying the following description of a method according to an embodiment of the present invention with reference to the accompanying drawing. In the drawing

DETAILED DESCRIPTION OF INVENTION

Figure 1:
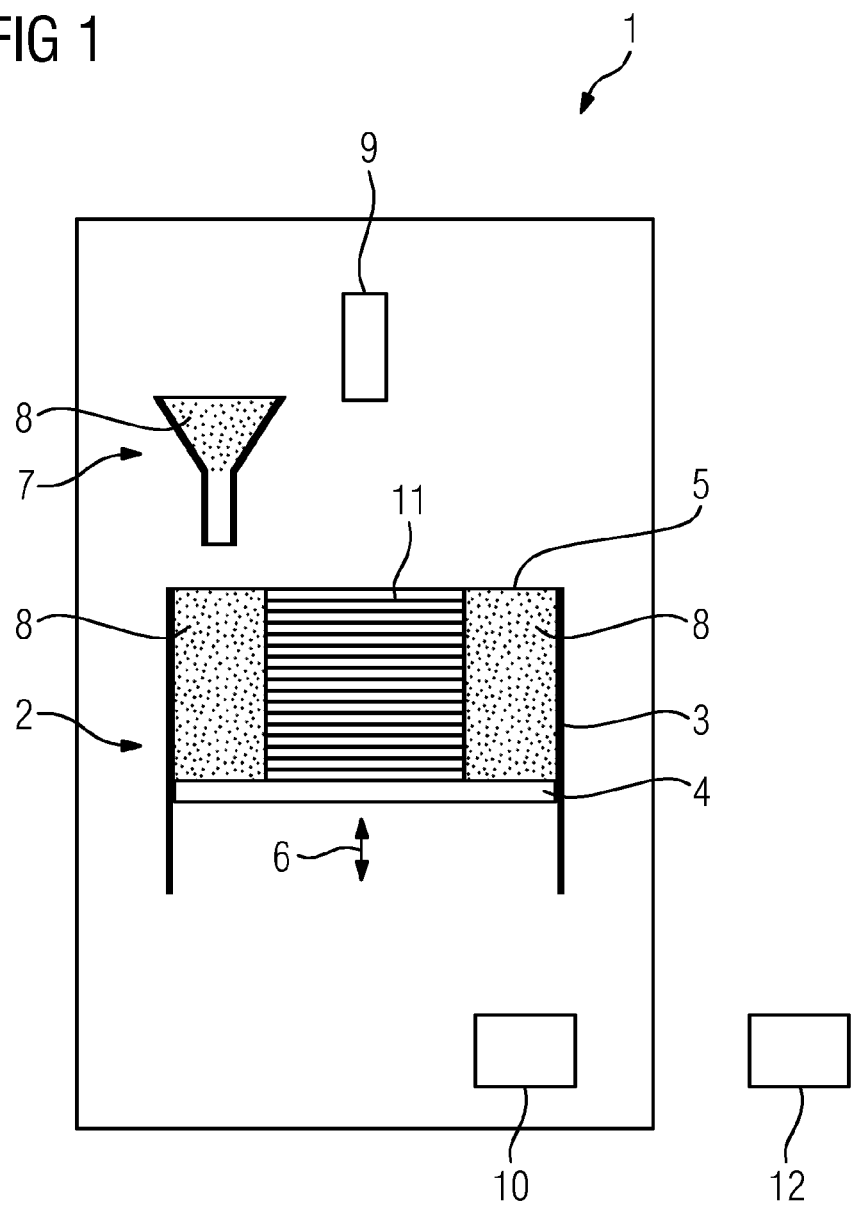
FIG. 1 is a schematic view of an exemplary additive manufacturing machine during the powder-based additive manufacture of a component using a method according to an embodiment of the present invention.

The additive manufacturing machine 1 comprises a container 2 having a circumferential side wall 3, which is closed at its bottom side by a horizontal construction platform 4. The construction platform 4 is received and guided within the container 2 in an upwardly and downwardly movable manner in parallel to a horizontal operating plane 5 defined at or close to the upper edge of the container 2, see arrow 6. A supply device 7, which is designed to spread a layer of powder 8 of a predetermined and constant height over the operating plane 5, and an irradiating source 9, such as a laser beam source or an electron beam source, which is designed to direct its beam onto and to move it over the operating plane 5 in a per se known manner, are positioned above the container 2. Moreover, a control unit 10 is provided, which is designed to coordinate the movements of the construction platform 4, the supply device 7 and the irradiating source 9 on the basis of 3D-CAD-data of a component 11 to be produced, which are designed and created by a designer on a computer 12 using a suitable computer software.

To produce a component 11 in a layer-wise manner in the additive manufacturing machine 1, the construction platform 4 is positioned in an upper position slightly below the operating plane 5 at first, whereupon a layer of powder 8 is spread over the construction platform 4 by means of the supply device 7 in such a manner, that the top face of the powder layer is placed within the operating plane 5. Thereafter, the lowest layer of the component 11 is solidified by moving the beam in accordance with the contour of said lowest layer. Then, the construction platform 4 is lowered by the height of one layer, and another layer of powder 8 is spread over the previous powder layer, which is again solidified in accordance with the next layer of the component 11. This procedure continues until the entire component 11 is built up. Thereafter, the construction platform 4 and the component 11 built thereon are placed in a heat treatment oven 13 in order to optimize the microstructure of the newly generated component 11.

Figure 2:
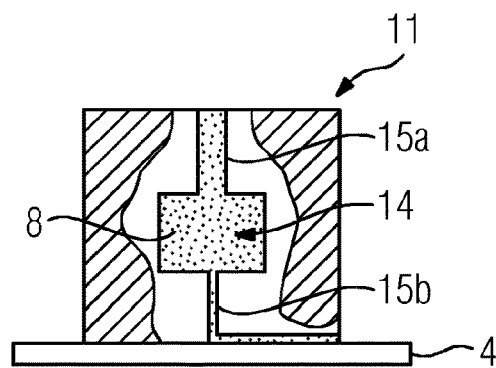
FIG. 2 is a partly sectional view of the component situated on a construction platform of the machine shown in FIG. 1.
Figure 3:
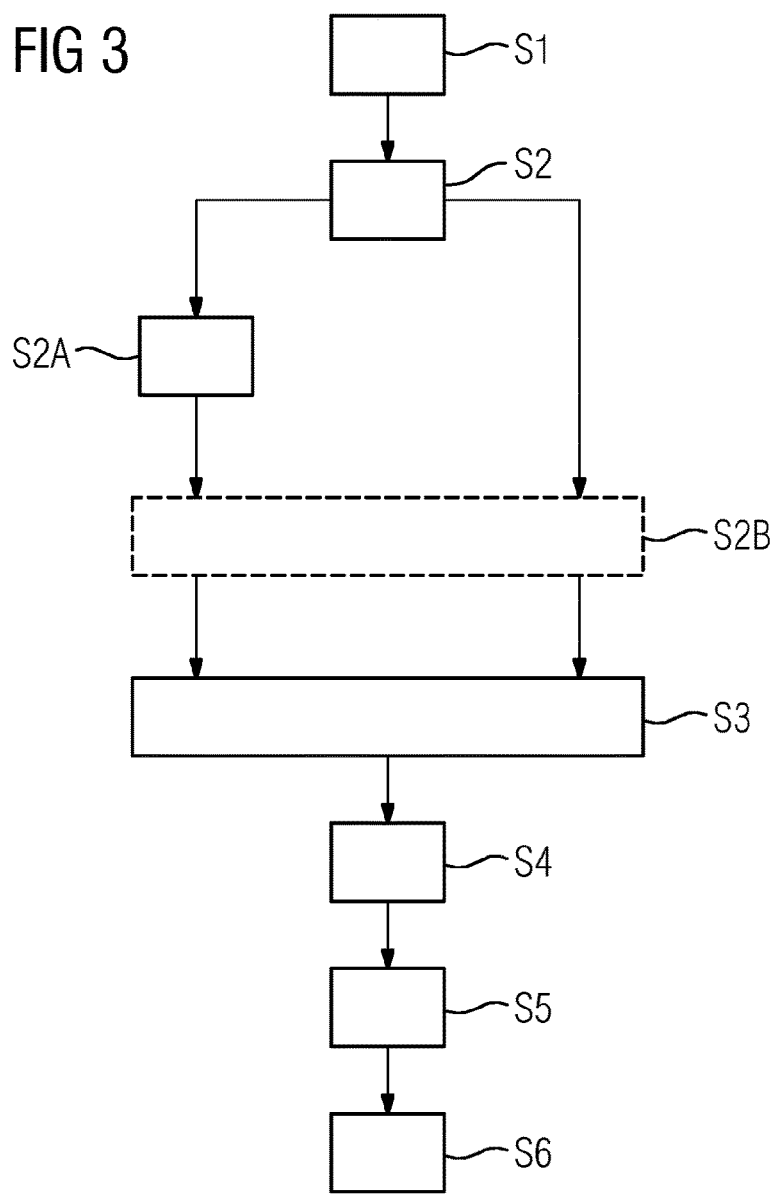
FIG. 3 is a flow chart showing the single steps of said method.

In the case, that the component 11 comprises one or more cavities 14, as shown in FIG. 2, these cavities 14 are filled with loose powder 8 of the component material while building up the component 11 in layers. Accordingly, after completion of the 3D-printing process this powder 8 present within the cavities 14 has to be removed prior to the following heat treatment process. Against this background it is of great importance to provide each cavity 14 with at least one outlet passage 15a, 15b connecting the cavity 14 to the outer environment of the component 11, through which the powder 8 can be discharged. Thus, during the design phase of the component 11 each cavity 14 has to be identified in the 3D-CAD-data in order to verify that it has at least one such outlet passage 15a, 15b. This problematic is addressed by the following method according to an embodiment of the present invention shown in FIG. 3.

In a first step S1 3D-CAD-data of the component 11 to be produced, which are suitable to be processed by the additive manufacturing machine 1, are created on the computer 12 by a designer using a computer-aided design method in the form of a computer software, such as NX, Magics, Netfabb or the like.

In a second step S2 the cavities 14 of the component 11 are automatically identified in the 3D-CAD-data and it is automatically verified, that each cavity 14 has at least one outlet passage 15a, 15b connecting the cavity 14 to the outer environment of the component 11. These sub-steps of identifying and verifying are carried out by applying a corresponding algorithm on the 3D-CAD-data created before. The algorithm may be incorporated in the computer-aided design method used in step S1. However, it can also be provided in the form of a separate computer program.

If it is detected in step S2, that the 3D-CAD-data comprise all necessary outlet passages 15a, 15b for all cavities 14, the 3D-CAD-data remain unchanged and are transferred to the control unit 10 of the additive manufacturing machine 1 in step S3.

However, if it is detected in step S2, that one or more necessary outlet passages 15a, 15b are missing, the missing outlet passages 15a, 15b are created within the 3D-CAD-data in step S2A. The creation of such passages can be done manually by the designer on the computer 12. In this case, an alarm signal is output at the end of step S2 to alert the designer that one or more outlet passages 15a, 15b are missing and. Preferably, the concerned cavities 14 are indicated. Alternatively, one or more suitable outlet passages 15a, 15b can automatically be calculated by the algorithm and be proposed to the designer. Then, the designer has the choice whether he accepts the proposal or refuses the proposal and manually creates the missing outlet passage(s) 15a, 15b on his own. As a further alternative, one or more of the missing outlet passages 15a, 15b can automatically be calculated and automatically created in the 3D-CAD-data by the algorithm without any interaction with the designer. The amended 3D-CAD-data are then transferred to the control unit 10, see step S3.

In step S4 the component 11 is produced on the construction platform 4 of the additive manufacturing machine 1 on the basis of the 3D-CAD-data as already described above.

Thereafter, the powder 8 present within the cavities 14 and within the outlet passages 15a, 15b is removed in step S5.

In a final step S6 the construction platform 4 and the component 11 arranged thereon are heat treated in the heat treatment oven 13.

According to a further embodiment of the method according to the present invention, the sub-step of step S2 of verifying that each cavity 14 has at least one outlet passage 15a, 15b connecting the cavity to the outer environment of the component 11 is performed in consideration of an intended orientation of the component 11 relative to the construction platform 4 during step S4. In other words it is verified whether or not outlet passages 15a, 15b will be blocked by the construction platform 4 when performing step S4.

Figure 4:
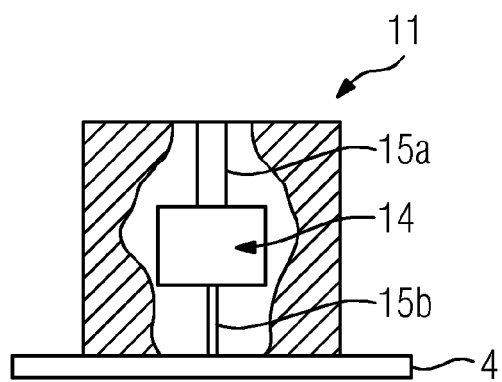
FIG. 4 is a partly sectional view of a further component situated on a construction platform, wherein the component and the platform have a first relative orientation.
Figure 5:
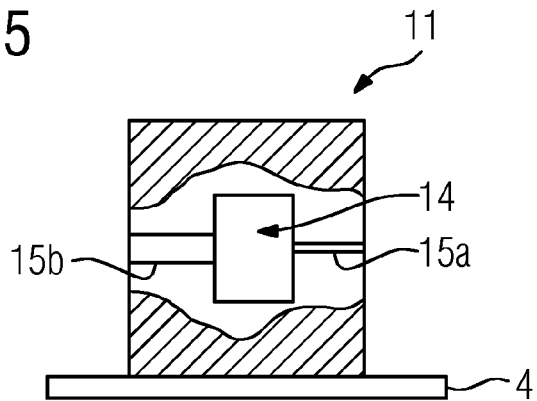
FIG. 5 is a partly sectional view of the component and the platform shown in FIG. 4, wherein the component and the platform have a second relative orientation.

If it is detected in step S2 by the algorithm, that one or more cavities 14 have outlet passages 15a, 15b, which will be blocked by the construction platform 4 in step S4, as shown in FIG. 4, see blocked outlet passage 15b, the algorithm automatically verifies in step S2B whether or not alternative orientations of the component 11 relative to the construction platform 4 are possible, which lead to less or no missing outlet passages 15a, 15b. If an alternative orientation is found, this alternative orientation is proposed to the designer, see FIG. 5. If the designer accepts the proposal, the 3D-CAD-data are modified accordingly. Moreover, new and/or modified outlet passages 15a, 15b are manually or automatically designed and incorporated in the 3D-CAD-data, if necessary.

According to yet another embodiment of the above-described method it is further verified by the algorithm in step S2 that each cavity 14 has at least two outlet passages 15a, 15b connecting the cavity 14 to the outer environment of the component 11, wherein, if there are no such two outlet passages 15a, 15b, they are created in the 3D-CAD-data, wherein, if a cavity 14 without two outlet passages 15a, 15b is detected, an alarm signal is output to alert the designer and/or the missing outlet passages 15a, 15b are automatically calculated and proposed to the designer and/or the missing outlet passages 15a, 15b are automatically calculated and automatically created within the 3D-CAD-data. Preferably, one of the outlet passages 15a is created to have a larger diameter than the other outlet passage 15b of the same cavity 14. This facilitates to introduce pressurized air through the outlet passage 15a of larger diameter and to blow out the powder 8 through the outlet passage 15b of smaller diameter in step S5.

Please note, that the figures merely show embodiments of the present invention. It should be note, that modifications are possible without departing from the scope of Protection defined by the claims. For example, the computer 12 and the algorithm can be incorporated in the control unit 10, if reasonable.

The invention claimed is:

1. A method for producing a three-dimensional component having one or more cavities by powder-based additive manufacturing, using an additive manufacturing machine, said method comprising the steps of:
    a) creating 3D-CAD-data of the component to be produced using a computer-aided design method, wherein said 3D-CAD-data are suitable to be processed by the additive manufacturing machine;
    b) identifying the cavities of the component in the 3D-CAD-data and verifying, that each cavity (14) has at least one outlet passage connecting the cavity to an outer environment of the component, wherein, if there is no such outlet passage, it is created within the 3D-CAD-data;
    c) producing the component on a construction platform of the additive manufacturing machine on the basis of the 3D-CAD-data;
    d) removing powder present within the cavities and within the outlet passages through said outlet passages while the component is arranged on the construction platform; and
    e) heat-treating the construction platform and the component arranged thereon in a heat treatment oven,
    wherein at least the sub-steps of step b) of identifying the cavities of the component within the 3D-CAD-data and of verifying that each cavity has at least one outlet passage connecting the cavity to the outer environment of the component, are performed automatically by applying an algorithm on the 3D-CAD-data, and, if a cavity without an outlet passage is detected, an alarm signal is output to alert the designer, and/or an outlet passage is automatically calculated and proposed to the designer, and/or an outlet passage is automatically calculated and automatically created in the 3D-CAD-data,
    wherein the sub-step of verifying that each cavity has at least one outlet passage connecting the cavity to the outer environment of the component includes determining whether the at least one passage is blocked by the construction platform using an intended orientation of the component relative to the construction platform during step c).

2. The method according to claim 1, wherein, if one or more cavities having outlet passages blocked by the construction platform are detected in step b), the method further comprising: outputting an alarm signal to alert the designer, and/or of automatically calculating new and/or modified outlet passages and proposing them to the designer, and/or of automatically calculating and automatically creating new and/or modified outlet passages in the 3D-CAD-data.

3. The method according to claim 1, wherein, if one or more cavities having outlet passages blocked by the construction platform are detected in step b), the method further comprising: automatically verifying whether or not alternative orientations of the component relative to the construction platform are possible, which lead to less or no missing outlet passages, and, if an alternative orientation is found, proposing said alternative orientation to the designer, or of automatically choosing said alternative orientation and automatically calculating and creating missing or modified outlet passages in the 3D-CAD-data.

4. The method according to claim 1, wherein in step b) it is verified that each cavity has at least two outlet passages connecting the cavity to the outer environment of the component, wherein, if there are no such two outlet passages, they are created in the 3D-CAD-data, wherein, if a cavity without two outlet passages is detected, an alarm signal is output to alert the designer, and/or the missing outlet passages are automatically calculated and proposed to the designer, and/or the missing outlet passages are automatically calculated and automatically created within the 3D-CAD-data.

5. The method according to claim 4, wherein the two outlet passages of each cavity have diameters of different size.

6. The method according to claim 5, wherein pressurized air is introduced through the outlet passage of larger diameter in step d).

7. The method according to claim 1, wherein the powder-based additive manufacturing comprises selective laser melting or electron beam melting.

* * * * *